United States Patent
Moore et al.

(10) Patent No.: US 7,063,603 B2
(45) Date of Patent: Jun. 20, 2006

(54) METHOD AND APPARATUS FOR CLEANING A WEB-BASED CHEMICAL MECHANICAL PLANARIZATION SYSTEM

(75) Inventors: Scott E. Moore, Meridian, ID (US); Dinesh Chopra, Boise, ID (US)

(73) Assignee: Micron Technology, Inc., Boise, ID (US)

(*) Notice: Subject to any disclaimer, the term of this patent is extended or adjusted under 35 U.S.C. 154(b) by 329 days.

(21) Appl. No.: 10/230,571

(22) Filed: Aug. 29, 2002

(65) Prior Publication Data

US 2003/0017706 A1    Jan. 23, 2003

Related U.S. Application Data

(62) Division of application No. 09/552,227, filed on Apr. 19, 2000, now Pat. No. 6,706,139.

(51) Int. Cl.
  *B24B 5/00*    (2006.01)
(52) U.S. Cl. ............... 451/285; 451/287; 451/443; 451/444
(58) Field of Classification Search ........ 451/285–290, 451/443, 444; 216/53, 89
See application file for complete search history.

(56) References Cited

U.S. PATENT DOCUMENTS

| | | | | |
|---|---|---|---|---|
| 3,604,434 A | * | 9/1971 | Hurst ................. | 134/58 R |
| 4,150,512 A | * | 4/1979 | Novak ................. | 451/444 |
| 4,525,955 A | * | 7/1985 | Cothrell et al. ....... | 451/296 |
| 5,738,574 A | * | 4/1998 | Tolles et al. .......... | 451/288 |
| 6,102,782 A | | 8/2000 | Custer et al. ......... | 451/67 |
| 6,139,402 A | | 10/2000 | Moore ................. | 451/41 |
| 6,146,246 A | | 11/2000 | Custer et al. ......... | 451/36 |
| 6,152,808 A | | 11/2000 | Moore ................. | 451/60 |
| 6,187,681 B1 | | 2/2001 | Moore ................. | 438/691 |
| 6,193,588 B1 | | 2/2001 | Carlson et al. ........ | 451/66 |
| 6,196,899 B1 | | 3/2001 | Chopra et al. ........ | 451/56 |
| 6,244,935 B1 | * | 6/2001 | Birang et al. ......... | 451/41 |
| 6,261,163 B1 | | 7/2001 | Walker et al. ........ | 451/311 |
| 6,273,796 B1 | | 8/2001 | Moore ................. | 451/56 |
| 6,306,014 B1 | | 10/2001 | Walker et al. ........ | 451/41 |
| 6,354,930 B1 | | 3/2002 | Moore ................. | 451/527 |
| 6,358,127 B1 | | 3/2002 | Carlson et al. ........ | 451/67 |
| 6,361,411 B1 | | 3/2002 | Chopra et al. ........ | 451/56 |
| 6,364,757 B1 | | 4/2002 | Moore ................. | 451/530 |
| 6,368,193 B1 | | 4/2002 | Carlson et al. ........ | 451/66 |
| 6,390,910 B1 | | 5/2002 | Moore ................. | 451/527 |
| 6,394,883 B1 | | 5/2002 | Carlson et al. ........ | 451/66 |
| 6,402,601 B1 | | 6/2002 | Walker et al. ........ | 451/311 |
| 6,419,560 B1 | | 7/2002 | Walker et al. ........ | 451/41 |
| 6,425,802 B1 | | 7/2002 | Custer et al. ......... | 451/5 |
| 6,428,404 B1 | | 8/2002 | Walker et al. ........ | 451/311 |
| 6,447,369 B1 | | 9/2002 | Moore ................. | 451/6 |
| 6,669,538 B1 | * | 12/2003 | Li et al. ............... | 451/56 |
| 2001/0029155 A1 | * | 10/2001 | Bennett et al. ........ | 451/56 |
| 2002/0100743 A1 | * | 8/2002 | Bonner et al. ........ | 216/53 |

* cited by examiner

*Primary Examiner*—M. Rachuba
(74) *Attorney, Agent, or Firm*—Fletcher Yoder

(57) ABSTRACT

A method and apparatus for cleaning a web-based chemical-mechanical planarization (CMP) system. Specifically, a fluid spray bar is coupled to a frame assembly which may be mounted on a CMP system. The fluid spray bar will move along the frame assembly. As the fluid spray bar traverses the length of the frame assembly, a cleaning fluid is sprayed onto the web in order to clean the web between planarization cycles.

7 Claims, 10 Drawing Sheets

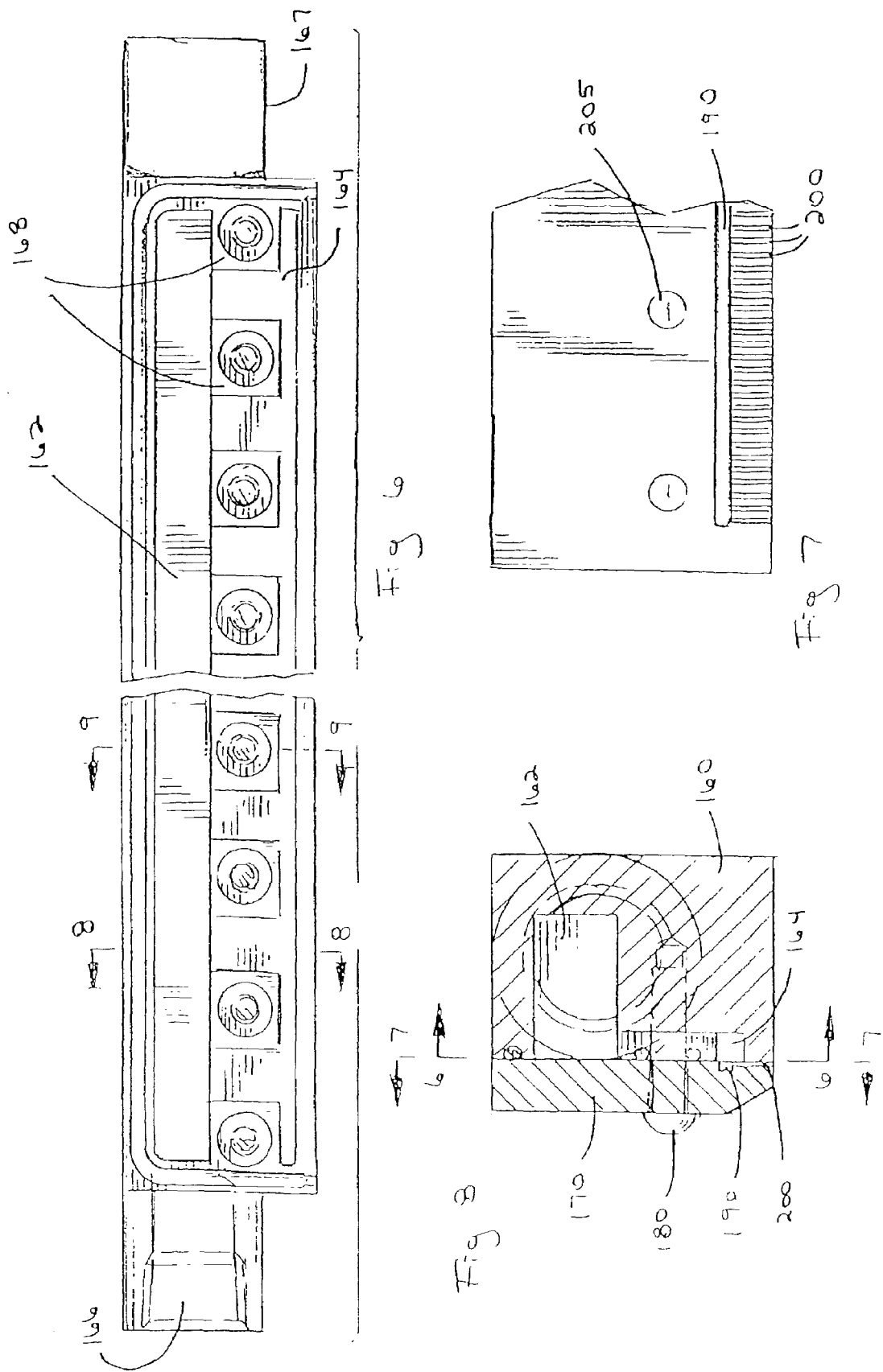

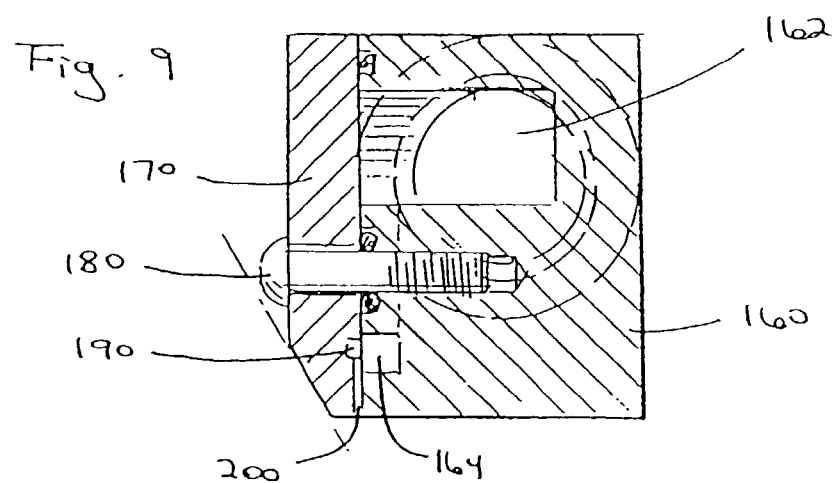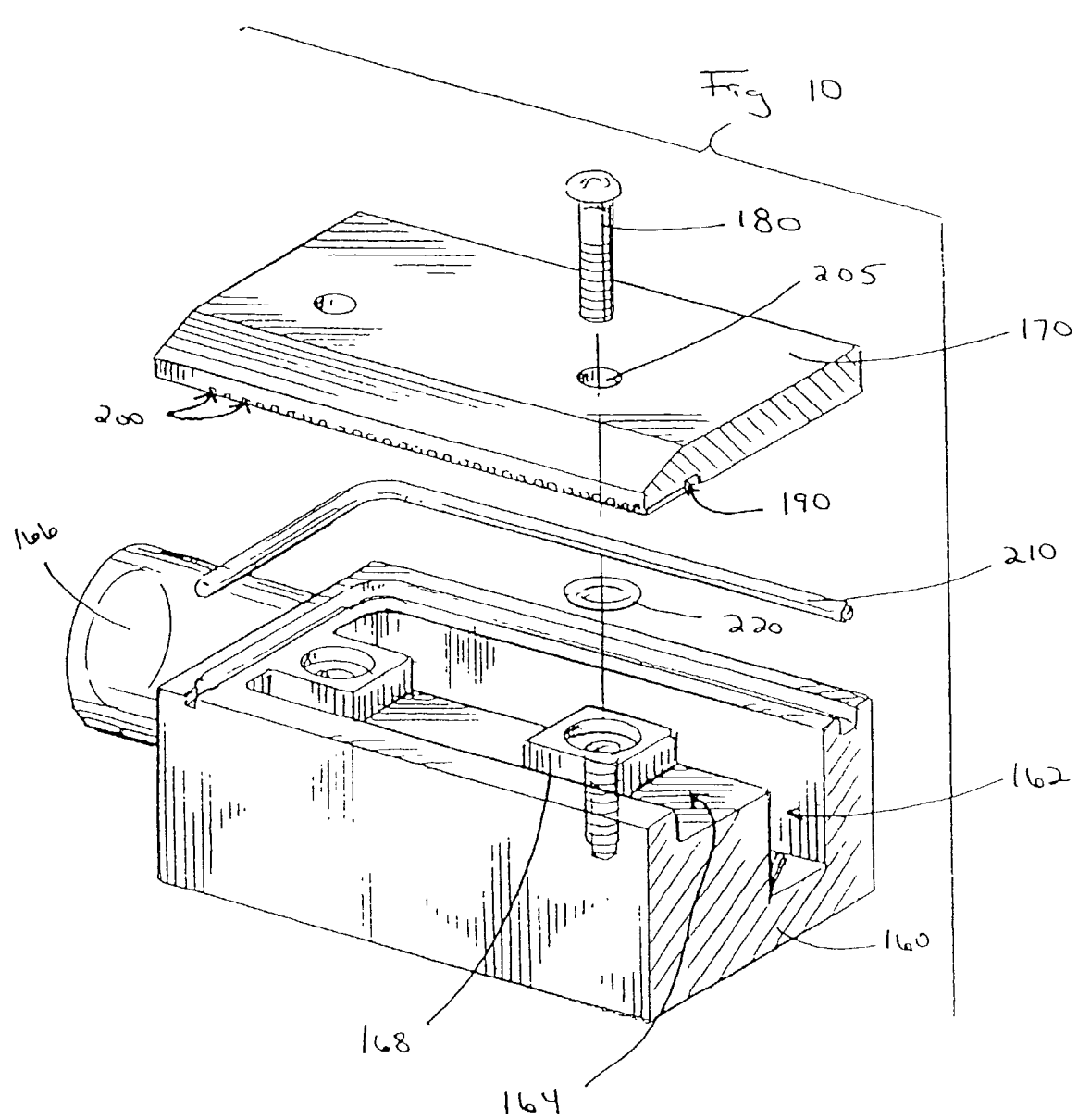

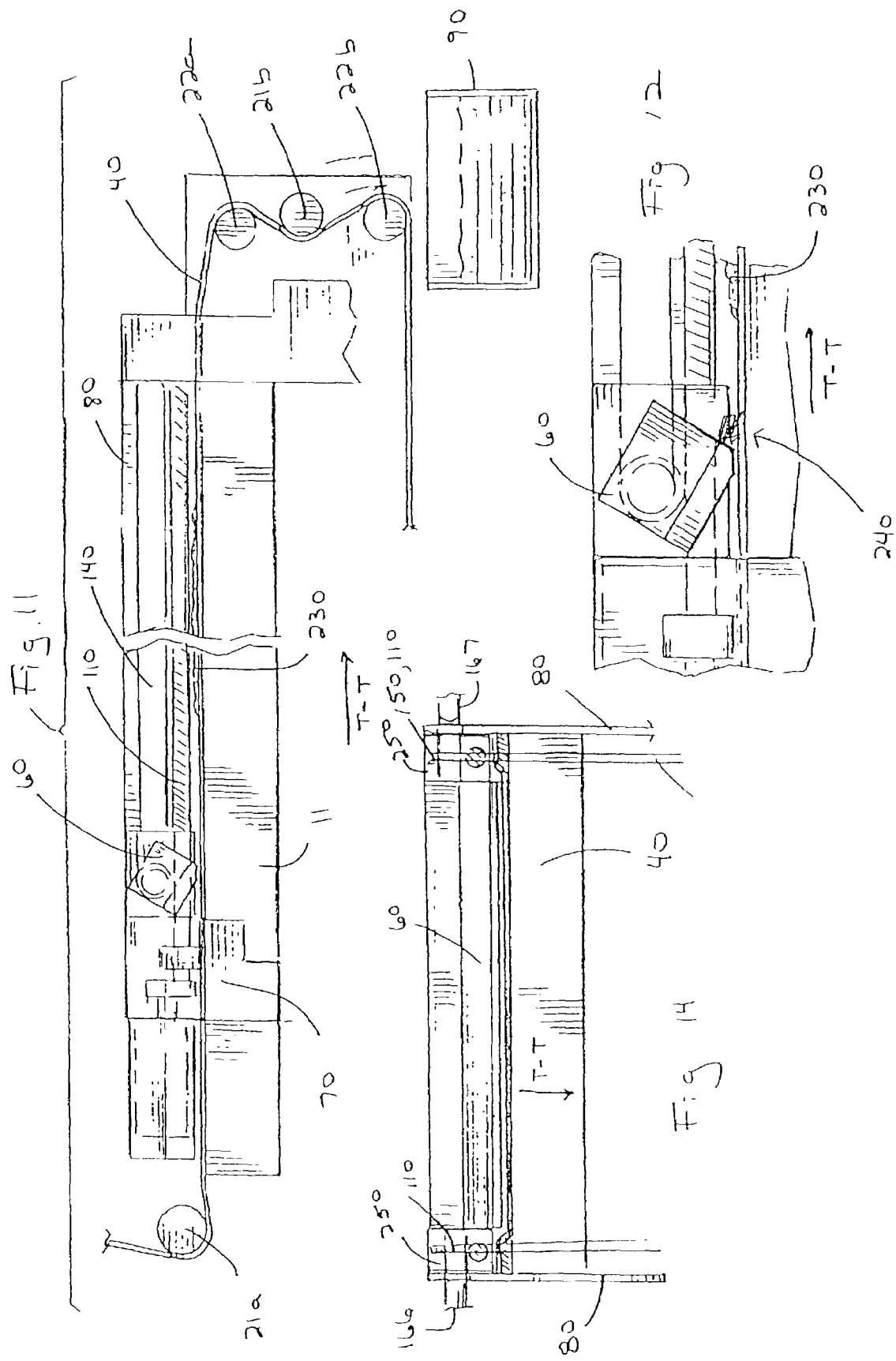

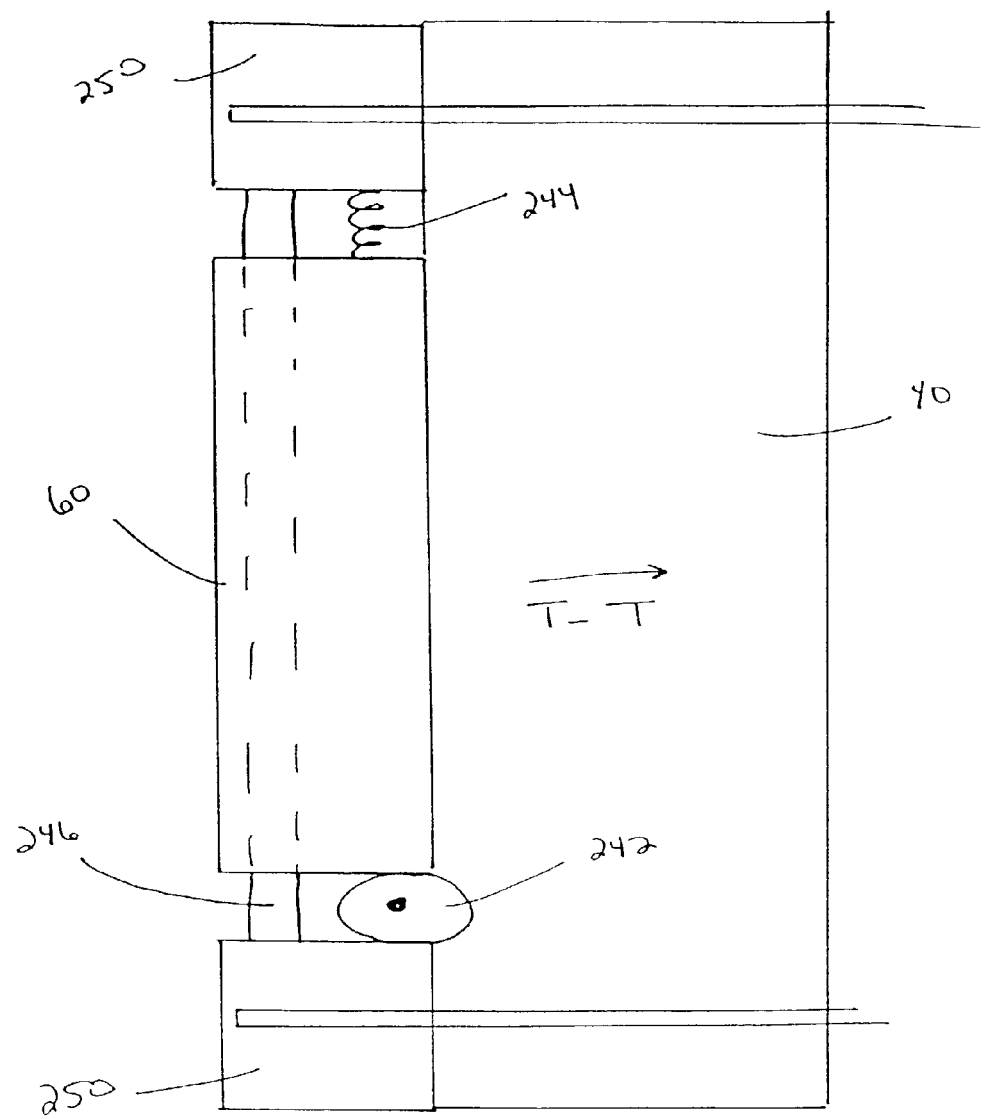

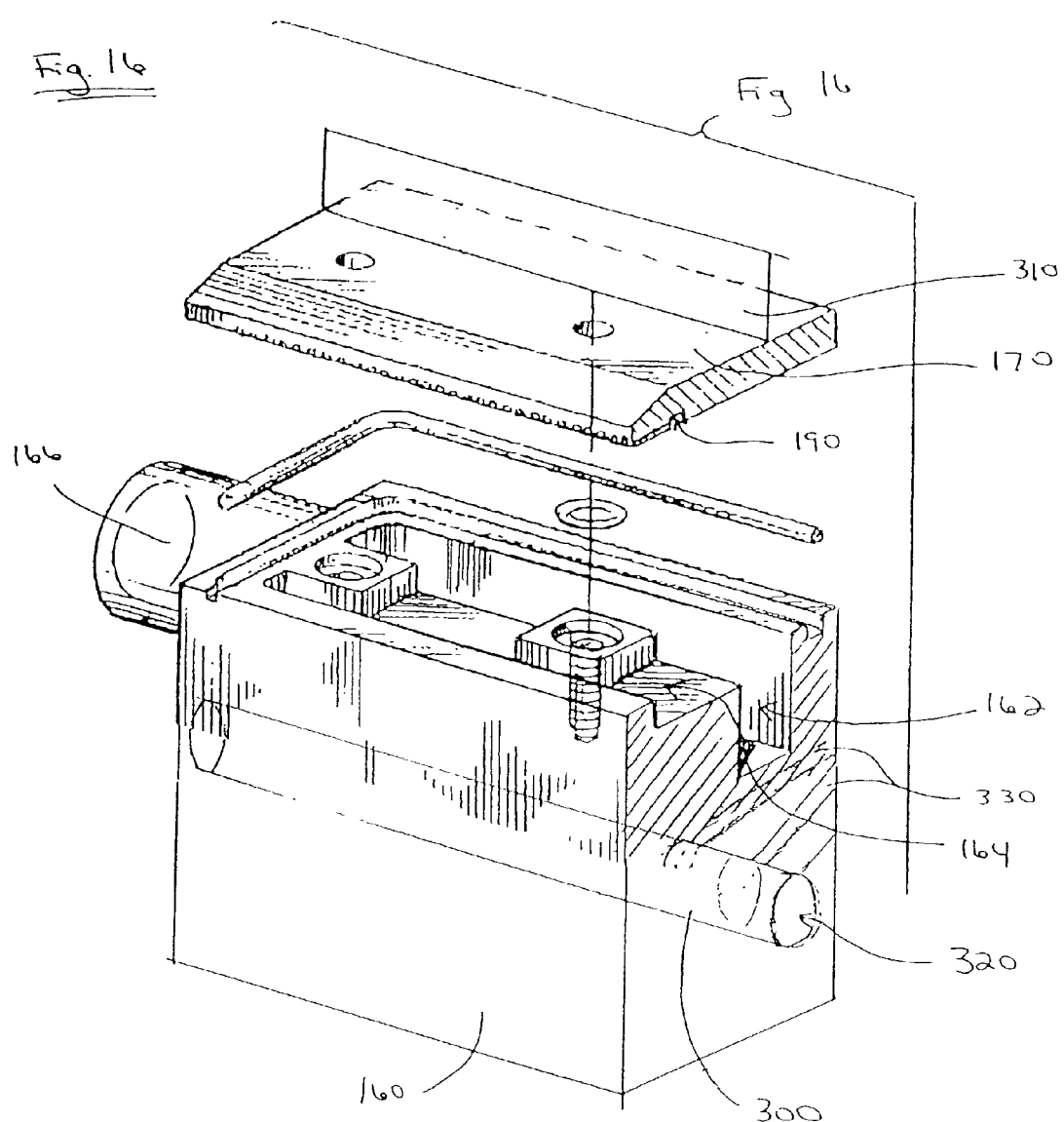

METHOD AND APPARATUS FOR CLEANING A WEB-BASED CHEMICAL MECHANICAL PLANARIZATION SYSTEM

This application is a divisional of application Ser. No. 09/552,227, filed on Apr. 19, 2000 now U.S. Pat. No. 6,706,139.

BACKGROUND OF THE INVENTION

1. Field of the Invention

The present invention relates to the fabrication of integrated circuits and, more particularly, to the field of polishing and planarizing semiconductor wafers.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Integrated circuits are generally mass produced by fabricating thousands of identical circuit patterns on a single semiconductor wafer and subsequently divided them into identical die or chips. Semiconductor wafers are generally made of silicon. To produce the integrated circuit many commonly known processes are used to modify, remove, and deposit material onto the semiconductor wafer. Processes such as ion implantation, sputtering, etching, chemical vapor deposition and variations thereof, such as plasma enhanced chemical vapor deposition, are among those commonly used. These processes are often selectively applied to an integrated circuit through the use of a masking process. In the masking process, a photomask containing the pattern of the structure to be fabricated is created, and the wafer is coated with a light sensitive material called photoresist. Then the resist-coated wafer is exposed to ultraviolet light through a photomask to soften or harden parts of the resist depending on whether positive or negative resist is used. Once the softened parts of the resist are removed, the wafer is treated by one of the processes as discussed above to modify, remove, or replace the part unprotected by the resist, and then the remaining resist is stripped. The masking process permits specific areas of the integrated circuit to be modified, removed, or replaced.

These steps of deposition or removal are frequently followed by a planarization step such as chemical mechanical planarization (CMP). Generally speaking, planarization is a process of removing material to render a surface smooth. CMP is the process of smoothing and planing aided by chemical and mechanical forces. The planarization process helps to minimize barriers to multilayer formation and metallization, as well as to smooth, flatten, and clean the surface. This process involves chemically etching a surface while also mechanically polishing it. The combined action of surface chemical reaction and mechanical polishing allows for controlled, layer-by-layer removal of the desired material from the wafer surface resulting in the preferential removal of protruding surface topography and producing a planarized wafer surface. In the past few years, CMP has become one of the most effective techniques for planarizing a semiconductor wafer.

In general, the CMP process involves holding a semiconductor substrate, such as a wafer against a rotating wetted polishing pad under controlled downward pressure. Alternately, the CMP process may involve holding a wetted polishing pad while rotating a semiconductor substrate, such as a wafer, under controlled downward pressure. A polishing slurry deposited onto the polishing pad contains etchants and an abrasive material such as alumina or silica. A rotating wafer carrier is typically utilized to hold the wafer under controlled pressure against a polishing pad. The polishing pad is typically made up of a soft material such as felt fabric impregnated with blown polyurethane.

The CMP process consists of moving a sample surface to be polished against a pad that is used to provide support against the sample surface, and providing slurry between a sample surface and pad to effect the polishing leading to planarization. Abrasive particles in the slurry cause mechanical damage on the sample surface, loosening the material for enhanced chemical attack or fracturing off the pieces of surface into a slurry where they dissolve or are swept away. The process is tailored to provide enhanced material removal rate with high points on surfaces, thus affecting the planarization. Note that chemistry alone typically will not achieve planarization because most chemical actions are isotopic. Mechanical grinding alone, theoretically, may achieve the desired planarization but is generally not desirable because of the extensive associated damage of the material surfaces.

As described above, the three key elements in the CMP process include the surface to be polished, the pad which enables the transfer of mechanical forces to the surface being polished, and the slurry which provides both chemical and mechanical effects. The term pad is used loosely to refer to any soft material which assists in material removal. One such pad is a polishing web. A polishing web is generally a continuous roll of material which is fed through a series of rollers on a CMP system. The web is fed across a table with a solid support surface where a rotating wafer carrier applies the downward mechanical force against the web in order to facilitated the polishing of the wafer. As a wafer is planarized, material is removed from the wafer and deposited onto the web. Before the next wafer is processed, the excess material deposited by the previous wafer should be removed from the web.

Currently, to clean the web between each planarization cycle, the web must be advanced from the polishing area and treated with a cleaning agent. To advance the web, the rollers on the CMP system must be rotated. If the rollers are advanced forward to facilitate the cleaning process, new webbing, previously unexposed because of its positioning on the web roll, will be exposed to possible contamination. Once the roll is retracted to its original position after the cleaning process, the contaminated portion of the web is rolled into the unexposed roll thereby introducing contaminants to previously unexposed portions of the web roll.

The present invention may address one or more of the problems set forth above.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, a fluid spray bar is coupled to a frame assembly. The frame assembly can be coupled to an existing CMP system to provide a means of cleaning the web without having to advance the web from its present position.

The fluid spray bar may include a plurality of fluid chambers. The fluid chambers may be filled with a web-cleaning fluid. A motor is coupled to the frame assembly. The motor facilitates the movement of the fluid spray bar along the length of the frame assembly. The fluid spray bar is positioned proximate to the web. After a CMP cycle, there are abrasive particles left on the web from the polishing of the wafer, as well as the chemical slurry used in the CMP process. In between planarization cycles, the web can be cleaned so that the same portion of the polishing web may be used to planarize another wafer.

To clean the web after a wafer has been polished, the fluid spray bar traverses the area of the web to be cleaned. As the fluid spray bar moves along the frame assembly, a cleaning fluid is dispensed onto the web. The cleaning fluid is deposited with a force and trajectory which is sufficient to remove the abrasive particles and excess chemical slurry from the polishing web.

This embodiment will facilitate reuse of web material without contaminating any of the pristine portions of the web.

BRIEF DESCRIPTION OF THE DRAWINGS

The foregoing and other advantages of the invention may become apparent upon reading the following detailed description and upon reference to the drawings representing exemplary embodiments in which:

FIG. 6 illustrates a plan view of the first member of a fluid spray bar in accordance with the present invention taken along line 6—6;

FIG. 7 illustrates a plan view of the second member of a fluid spray bar in accordance with the present invention taken along line 7—7;

FIG. 8 illustrates a cross-sectional view of the fluid spray bar taken along line 8—8;

FIG. 9 illustrates a cross-sectional view of the fluid spray bar taken along line 9—9;

FIG. 10 illustrates an exploded view of a portion of the fluid spray bar;

FIG. 11 illustrates a side view of the fluid spray bar coupled to the web-format planarizing machine;

FIG. 12 illustrates an enlarged view of the fluid spray bar coupled to the web-format planarizing machine;

FIG. 13 illustrates an alternate embodiment of the fluid spray bar;

FIG. 14 illustrates a top view of the fluid spray bar coupled to the frame assembly;

FIG. 16 illustrates an exploded view of a portion of the fluid spray bar assembly comprising an additional chamber, and a squeegee.

DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
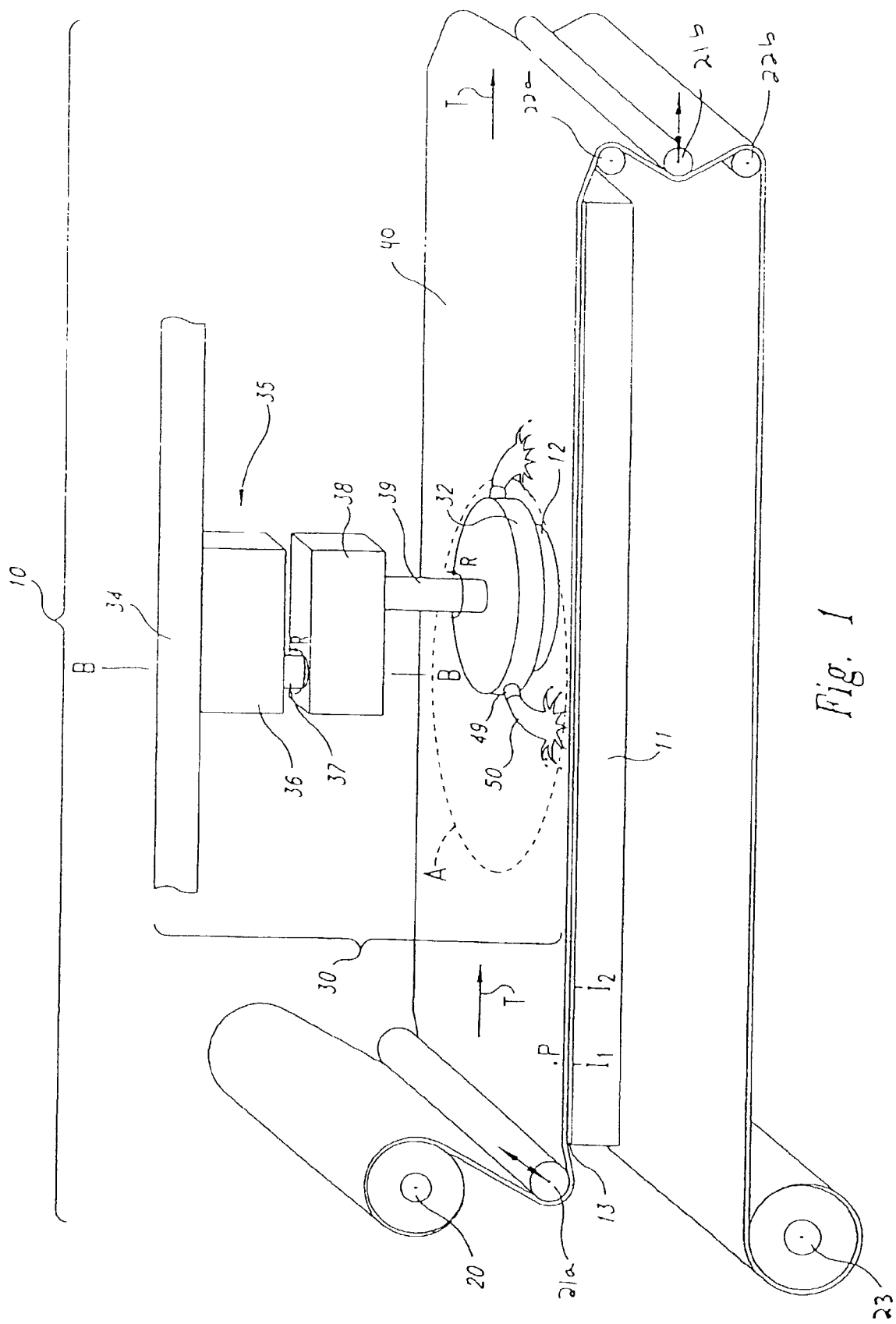
FIG. 1 illustrates a perspective view of an exemplary web-format planarizing machine.

FIG. 1 is a schematic isometric view of an exemplary web-format planarizing machine 10 for planarizing a substrate 12 which may benefit from the present invention, although it will be understood that the machine 10 may take other forms that may benefit as well. The planarizing machine 10 has a table 11 with a rigid panel or plate to provide a flat, solid support surface 13 for supporting a portion of a web-format planarizing pad 40 in a planarizing zone "A." The planarizing machine 10 also has a pad advancing mechanism including a plurality of rollers to guide, position, and hold the web-format pad 40 over the support surface 13. The pad advancing mechanism generally includes a supply roller 20, tensioning rollers 21a and 21b, idler rollers 22a and 22b and a take-up roller 23.

As explained below, a motor (not shown) drives the take-up roller 23 to advance the pad 40 across the support surface 13 along a travel axis T-T. The motor can also drive the supply roller 20. The idler rollers 22a and 22b press an operative portion of the pad against the support surface 13 to hold the pad 40 stationary during operation.

The planarizing machine 10 also has a carrier assembly 30 to translate the substrate assembly 12 across the pad 40. In one embodiment, the carrier assembly 30 has a head 32 to pick up, hold, and release the substrate 12 at appropriate stages of the planarizing process. The head 32 may also be configured to rotate about the shaft 39. The carrier assembly 30 also has a support gantry 34 and a drive assembly 35 that can move along the gantry 34. The drive assembly 35 has an actuator 36, a drive shaft 37 coupled to the actuator 36, and an arm 38 projecting from the drive shaft 37. The arm 38 carriers the head 32 via a second shaft 39. The actuator 36 orbits the head 32 about an axis B-B to move the substrate 12 across the pad 40. While the present embodiment provides a system which supports both rotation of the substrate 12 (about the shaft 39) and orbiting (about an axis B-B), an alternate embodiment may provide a system which provides either rotation alone or orbiting alone. Further, some current systems use a planar vibration, rather than a rotation or orbit. The present invention may also be implemented in CMP systems which use planar vibration to provide differential motion between the positioning pad and the substrate.

The polishing pad 40 may be a non-abrasive polymeric pad (e.g., polyurethane), or it may be a fixed-abrasive polishing pad in which abrasive particles are fixedly dispersed in a resin or another type of suspension medium. A planarizing fluid is deposited onto the pad 40 as part of the planarizing operation. While various techniques may be used for depositing this fluid, in this embodiment, the planarizing fluid 50 flows from a plurality of nozzles 49 during planarization of the substrate 12. The planarizing fluid 50 may be a conventional CMP slurry with abrasive particles and chemicals that etch and/or oxidize the surface of the substrate assembly 12, or the planarizing fluid 50 may be a "clean" non-abrasive planarizing solution without abrasive particles. In most CMP applications, abrasive slurries with abrasive particles are used on non-abrasive polishing pads, and non-abrasive clean solutions without abrasive particles are used on fixed-abrasive polishing pads.

During the operation of the planarizing machine 10, the pad 40 moves across the support surface 13 along the pad travel path T-T either during or between planarizing cycles to change the particular portion of the polishing pad 40 in the planarizing zone A. For example, the supply and take-up rollers 20 and 23 can drive the polishing pad 40 between planarizing cycles such that a point P moves incrementally across the support surface 13 to a number of intermediate locations $I_1$, $I_2$, etc. Alternatively, the rollers 20 and 23 may drive the polishing pad 40 between planarizing cycles such that the point P moves all the way across the support surface 13 to completely remove a used portion of the pad 40 from the planarizing zone A. The rollers may also continuously drive the polishing pad 40 at a slow rate during a planarizing cycle such that the point P moves continuously across the support surface 13. Thus, the polishing pad 40 should be free to move axially over the length of the support surface 13 along the pad travel path T-T.

To reuse a portion of polishing pad 40, the polishing pad 40 may be advanced along pad travel path T-T between planarizing cycles. The polishing pad 40 is advanced far enough to allow the portion of the polishing pad 40, which was previously in the planarizing zone A to be clear of the planarizing zone A so that it may be cleaned. Once the previously used portion of the polishing pad 40 is cleaned, the supply roller 20 is reversed, thereby placing the polishing pad 40 in its previous position to allow reuse of the portion of the polishing pad 40 which was used in the previous planarizing cycle.

Disadvantageously, by advancing the polishing pad 40 along travel path T-T to facilitate cleaning, a previously unexposed portion of polishing pad 40 is exposed to possible contamination as it is advanced from the supply roller 20. As the polishing pad 40 is reversed to facilitate reuse of the cleaned area, the exposed portion of polishing pad 40 is reintroduced to the portion of polishing pad 40 which is still on the supply roller 20. This introduces contaminants to the previously clean and unexposed portion of polishing pad 40.

Figure 2:
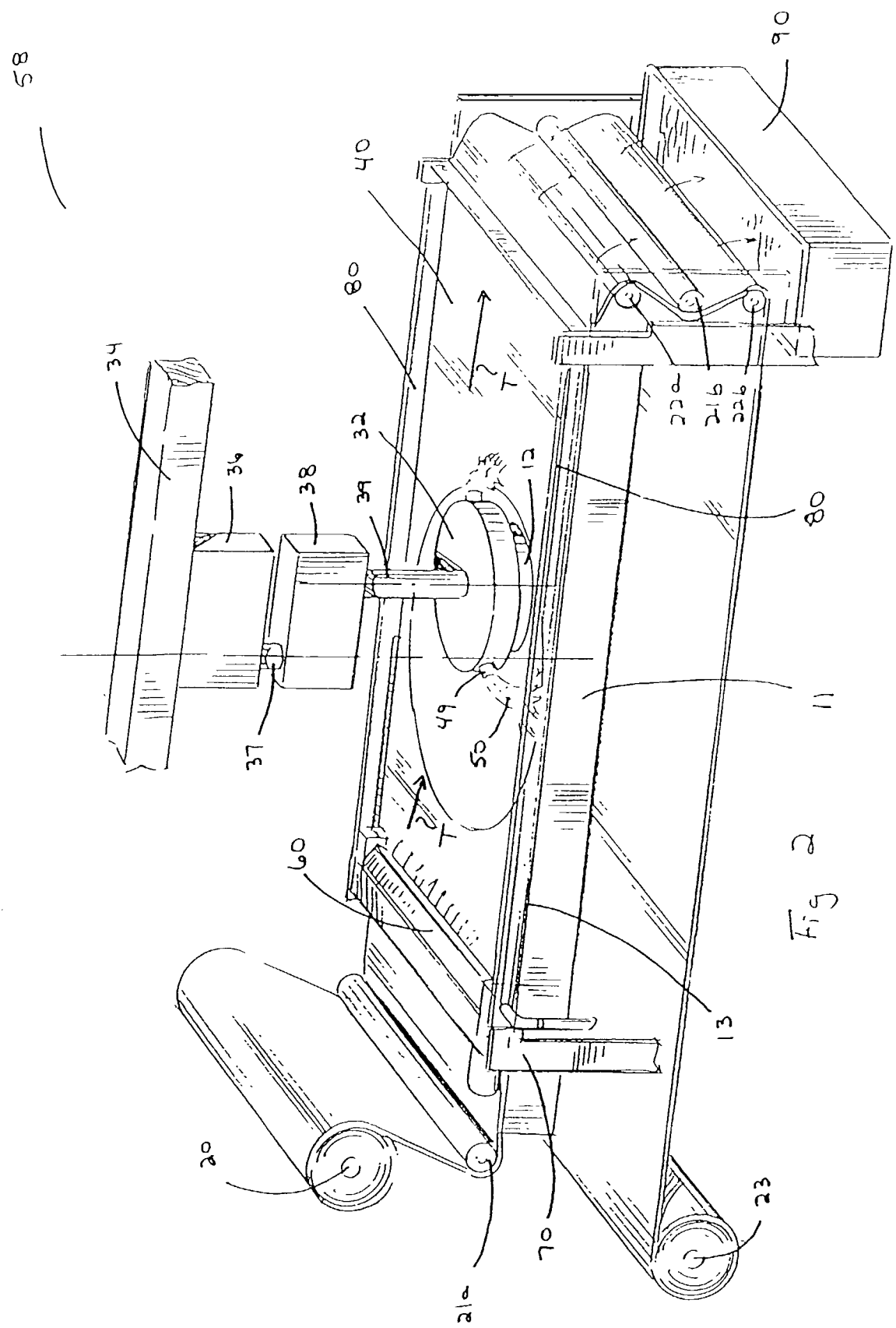
FIG. 2 illustrates a perspective view of a web-format planarizing machine in accordance with the present invention.

FIG. 2 illustrates a perspective view of a web-format planarizing machine 58 which includes an exemplary web-cleaning apparatus. FIG. 2 illustrates the planarizing machine 58 as depicted in FIG. 1 with the fluid spray bar 60 and frame assembly 70. The fluid spray bar 60 may be comprised of a fluid chamber which permits a cleaning fluid to be dispensed on the surface of the web to facilitate cleaning. As can be seen in FIG. 2, the fluid spray bar 60 is coupled to the frame assembly 70 in such a way as to allow the fluid spray bar 60 to traverse path T-T between planarizing cycles. The fluid spray bar 60 may travel along rails 80 between planarizing cycles to dispense a web cleaning fluid. The fluid spray bar 60 may be activated immediately after a polishing cycle to rinse any particles or fluids from the polishing web 40. Likewise, the fluid spray bar 60 may be activated immediately prior to a polishing cycle to wet the polishing web 40, which may assist in the CMP process.

However, it may not be desirable to activate the spray bar 60 between each polishing cycle. Instead, the polishing web 40 may be activated intermittently between some fixed number of polishing cycles or at any time that the polishing web 40 needs cleaning.

The fluid spray bar 60 dispenses the fluid at such an angle and with such force so as to remove polish refuse deposited during the planarizing process from the web surface. The polish refuse and cleaning fluid are then carried to the fluid depository 90. It should be noted that the laminar flow of the cleaning fluid, as determined by the angle and positions of the spray nozzles (illustrated in FIGS. 7–10), can be adjusted such that no excess cleaning fluid is left on the polishing web 40. However, it may be desirable to leave some amount of excess cleaning fluid on the polishing web 40. In this instance, the fluid spray bar 60 can be adjusted to provide for this effect.

As discussed above, the fluid spray bar 60 may be used to dispense a cleaning agent onto the polishing web 40 between polishing cycles. Generally, the wafer is removed from the planarizing machine 58 during the dispensing of the cleansing agent. It may also be desirable to use the fluid spray bar 60 to dispense a corrosion inhibitor such as Benzine Tryazole (BTA). During the planarization process, slurry material may attach itself to the wafer. Because the wafer often includes metal traces on its surface, the traces and pads may begin to corrode due to the slurry deposition. To mitigate this effect, the fluid spray bar 60 may dispense a corrosion inhibitor to rinse the wafer before the wafer is removed from the planarization machine 58. The corrosion inhibitor may be dispensed for as little as 3 to 5 seconds to drive any remaining slurry from the surface of the wafer and passivate the wafer with the corrosion inhibitor.

An alternate embodiment may provide a means for removing excess cleaning fluid which has been dispensed on the web 40 by the fluid spray bar 60. The fluid spray bar 60 may comprise a squeegee 310 (shown in FIG. 16) to sweep the surface of web 40 as the fluid spray bar 60 traverses path T-T in the direction opposite to the direction of motion of the fluid spray bar 60 while it was dispensing the cleaning fluid. Alternately, the fluid spray bar 60 may comprise air blowers to blow any excess cleaning fluid from the web 40 as the fluid spray bar 60 traverses path T-T in the direction opposite to the direction of motion of the fluid spray bar 60 as it was dispensing the cleaning fluid. The air blowers provide an alternate, non-contact means of removing the excess cleaning fluid from the web 40.

Referring again to FIG. 16, the first member 160 may also comprise an additional chamber 300 which may be an air chamber through which air may flow to assist in removing the excess cleaning fluid form the web 40. The air may enter through a hose (not shown) which may be attached to an opening 320 at the end of the additional chamber 300. The air may be blown onto the web by a second set of nozzles 330 located on the back side of the fluid spray bar 60.

Figure 3:
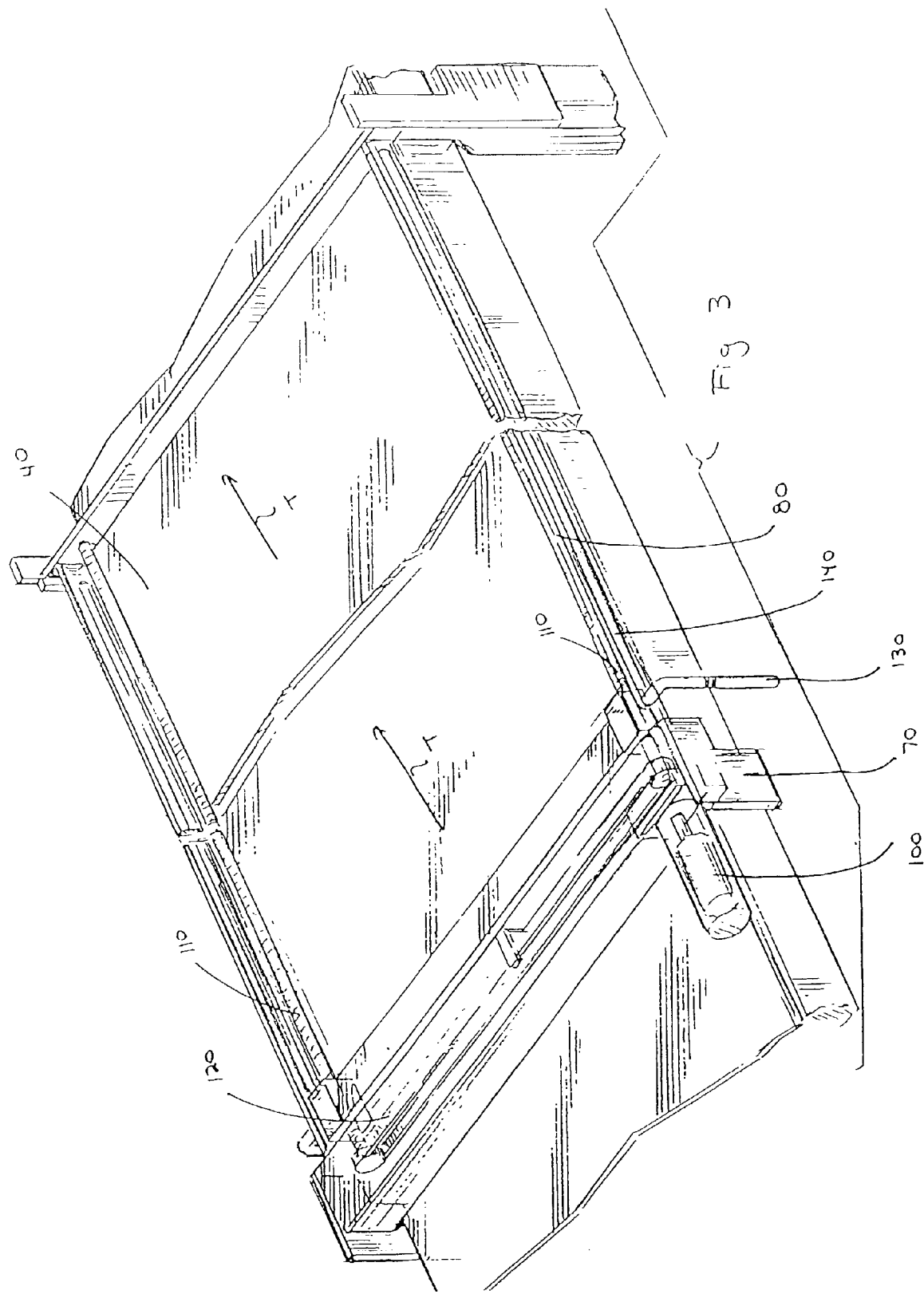
FIG. 3 illustrates a perspective view, showing external and internal features of one embodiment of a frame assembly in accordance with the present invention.
Figure 4:
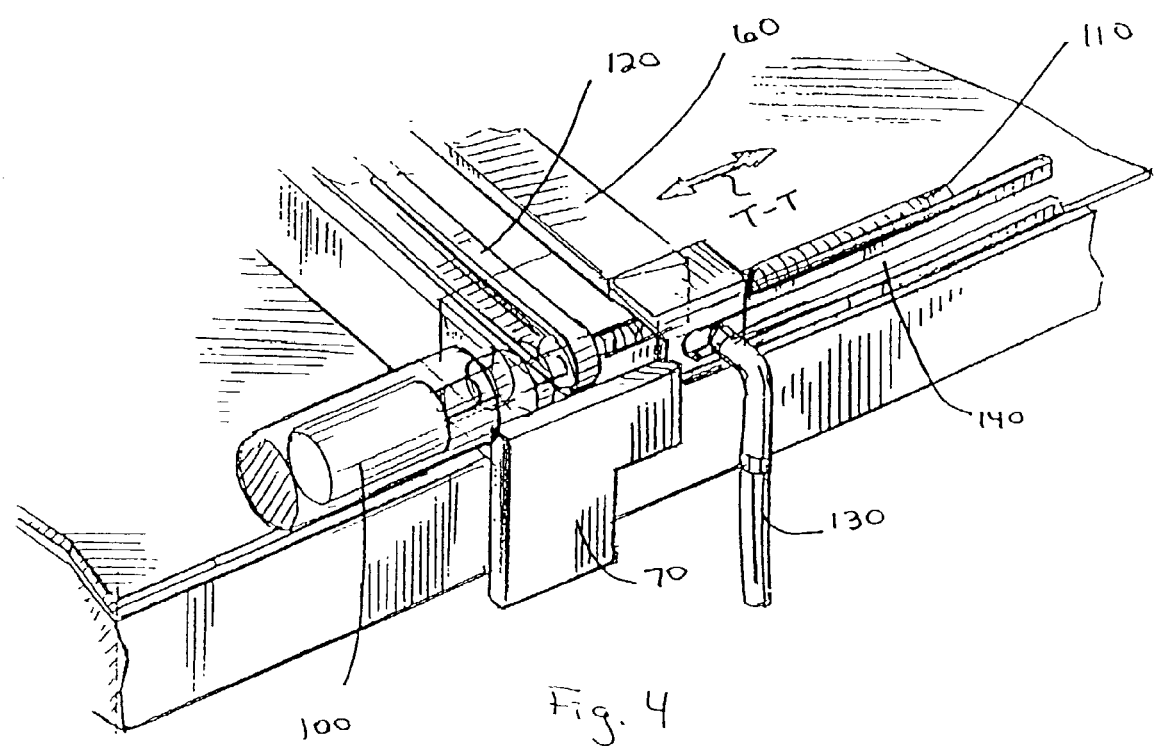
FIG. 4 illustrates a detailed view of the motor portion of the frame assembly illustrated in FIG. 3.

FIGS. 3 and 4 illustrate one exemplary embodiment of the frame assembly 70 with the understanding that various mechanisms may be used to cause the flow bar 60 to move relative to the pad 40 during the cleaning operation. A motor 100 is coupled to frame assembly 70 to drive the fluid spray bar 60 along each of the rails 80. In this embodiment, lead screws 110 are mounted along rails 80. The lead screws 110 are connected by belt 120. Motor 100 drives the belt 120 so as to turn lead screws 110, thereby facilitating the movement of the fluid spray bar 60 along pad travel path T-T. As the fluid spray bar 60 traverses travel path T-T, a web cleaning fluid may be dispensed from the spray bar assembly 60 onto the web-format polishing pad 40. The motor 100 in the frame assembly 70 will also permit variable travel speeds of approximately one quarter inch per second to three inches per second, for example, depending on the web material composition and the amount of cleaning required.

FIG. 4 illustrates an enlarged view of the embodiment disclosed in FIG. 3. As motor 100 rotates the lead screw 110 and the belt 120, the fluid spray bar 60 moves along travel path T-T. For the fluid spray bar 60 to receive web cleaning fluid, a fluid hose 130 is coupled to the fluid spray bar. As the fluid spray bar 60 moves along travel path T-T, the fluid hose 130 may also travel along path T-T. To facilitate the movement of fluid hose 130, fluid hose slot 140 may be provided along the rails 80.

Figure 5:
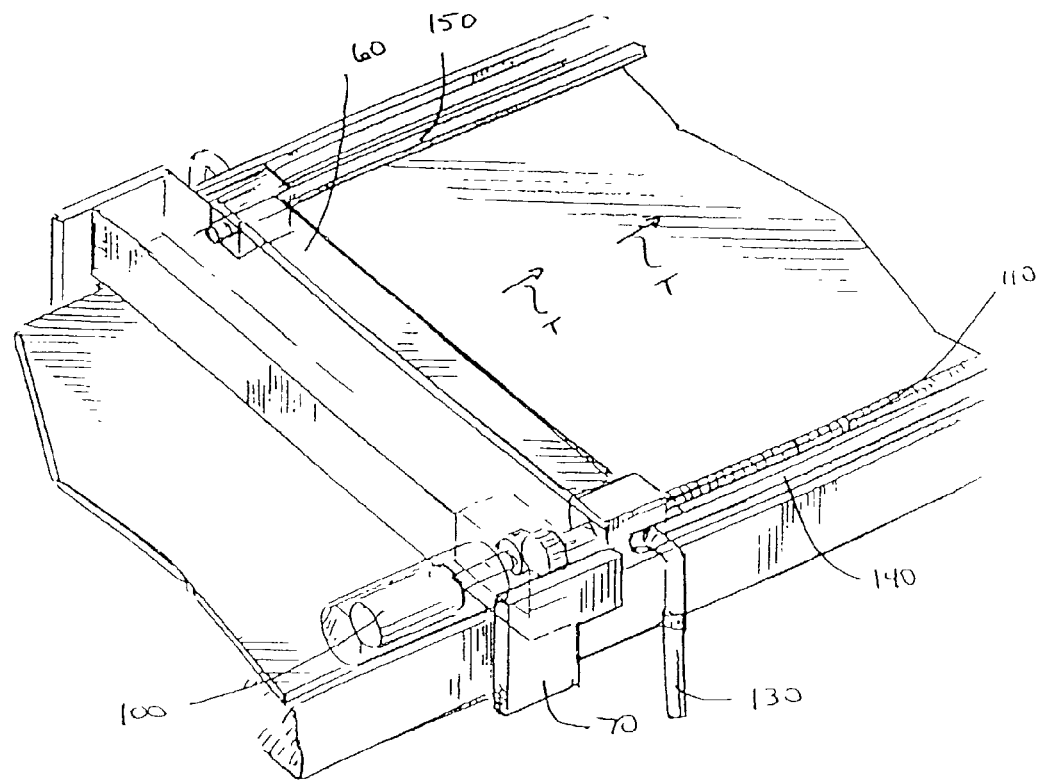
FIG. 5 illustrates a perspective view, showing external and internal features of an alternate embodiment of the frame assembly in accordance with the present invention.

FIG. 5 illustrates an alternate embodiment of the frame assembly 70. Here, the motor 100 will turn the single lead screw 110. In this embodiment, there is no belt 120 because there is no lead screw 110 on the side of frame assembly 70 which is opposite motor 100. Instead, a guide rod 150 is provided to facilitate uniform movement of the fluid spray bar 60 along the travel path T-T.

While the spray bar assembly 60 may take various suitable forms, FIGS. 6 through 10 illustrate one exemplary embodiment of the fluid spray bar 60. As can best be seen in FIG. 10, the fluid spray bar 60 advantageously includes two members, illustrated by reference numerals 160 and 170. FIG. 6 illustrates a plan view of the first member 160 while FIG. 10 illustrates an exploded view of the fluid spray bar 60, including first member 160. The first member 160 includes a primary fluid chamber 162 and a secondary fluid chamber 164. The web cleaning fluid enters the primary fluid chamber 162 through the inlet 166 which is attached to the fluid hose 130 (shown in FIGS. 6–10). The first member 160 utilizes mounting brackets 168 to facilitate attachment of the second member 170. The mounting brackets 168 are configured to receive screws 180 that secure the second member 170 to the first member 160 and thus form the fluid spray bar 60. The first member 160 also advantageously includes a guiding member 167 that ensures uniform movement of the fluid spray bar 60 as it traverses the web. The guiding member is inserted in a rail slot on the side of the system opposite the fluid hose 130, as will be further illustrated herein.

The second member 170 is best illustrated by referring to FIG. 7 and FIG. 10. FIG. 7 illustrates a backside plan view of the second member 170. The second member 170 includes a fluid chamber 190 and spray nozzles 200. The second member 170 is coupled to the first member 160, as shown in FIG. 10, in such a way as to allow the fluid chamber 190 of the second member 170 to align with the secondary fluid chamber 164 of first member 160, The first member 160 is coupled to the second member 170 by screws 180, which pass through screw hole 205 in the second member. Fluid chamber 190 is also fluidically coupled to spray nozzles 200. As the cleaning fluid enters the primary fluid chamber 162 through inlet 166, the fluid fills the primary fluid chamber 162 and then flows into the secondary fluid chamber 164. Because the second member 170 is coupled to first member 160 in such a way as to align fluid chamber 190 with the secondary fluid chamber 164, fluid chamber 190 also fills with web cleaning fluid. Because the fluid spray nozzles 200 are fluidically coupled to the fluid chamber 190, the web cleaning fluid is forced through the spray nozzles 200 and onto the web 40 (not shown).

Referring still to FIG. 10, a seal 210 may be used between the first member 160 and the second member 170 to provide an even contact and secure coupling in the fluid spray bar 60. Seal ring 220 may also be used to ensure no leakage of the cleaning fluid into the mounting brackets 168.

FIGS. 8 and 9 illustrate a cross-sectional view of the fluid spray bar 60 along lines 8—8 and 9—9, respectively. The only difference between FIG. 8 and FIG. 9 is that FIG. 9 is a cross-section taken through screw 180, while FIG. 8 is a cross-section taken only through the fluid chambers 162, 164 and 190. Primary fluid chamber 162 can be seen as the largest fluid reservoir. FIGS. 8 and 9 also show the fluid coupling between fluid chamber 190 in the second member 170 and secondary fluid chamber 164 in the first member 160. Once the first member 160 is coupled to the second member 170, the spray nozzles 200 are formed to provide an outlet for the web cleaning fluid.

An alternate embodiment of the fluid spray bar may include only a single member. The single member may contain one or more fluid chambers, which are coupled to nozzles that dispense the cleaning fluid onto the web.

FIG. 11 illustrates a cross-sectional view of the fluid spray bar 60 coupled to the web-format planarizing machine. As can be seen, the fluid spray bar 60 travels along rails 80 along the travel path T-T. After a planarizing cycle, polish refuse 230 will remain on the web 40. The polish refuse 230 is a result of the material removal on the polishing surface which has been deposited onto web 40. As fluid spray bar 60 traverses path T-T by means of frame assembly 70, a web cleaning fluid is deposited onto web 40 to remove the polish refuse 230 from the web 40. The polish refuse 230 is swept by the cleaning fluid into the fluid depository 90.

This process is better illustrated by FIG. 12 which illustrates an enlarged view of the fluid spray bar coupled to the web-format planarizing machine 58. Again, as the fluid spray bar 60 traverses travel path T-T along lead screw 110, the fluid spray bar 60 deposits a web cleaning fluid 240 onto the web surface 40. After the polishing cycle, the web 40 is held stationary while the fluid spray bar 60 travels the length of the polish area spraying a web cleaning fluid, such as deionized water, a ph-adjusted solution such as ammonia, or a surfactant. The spray stream of the web cleaning fluid 240 is positioned approximately one quarter to one eighth of an inch above the web 40 at a low angle (10° to 30°). This small distance and low angle cause the fluid 240 to create a sweeping action on the surface of the web 40. This sweeping action carries the polish refuse 230 and excess chemicals off of the web 40 and into the fluid depository 90 (not shown) leaving the web surface puddle free.

While the present embodiment discloses a fluid spray bar 60 which deposits a laminar flow onto the web 40 through a series of spray nozzles 200 in such a way as to permit complete spray coverage of the polishing region of web 40 while the fluid spray bar 60 moves only in the T-T direction, it should be appreciated that alternate embodiments may be incorporated. One such embodiment may cause the fluid spray bar 60 to oscillate in a direction which is perpendicular to travel path T-T. Structurally, this embodiment may be constructed using a cam 242 and spring 244, as illustrated in FIG. 13. The fluid spray bar 60 may be mounted on guide blocks 250. A shaft 246 may be mounted through the fluid spray bar 60 and guide blocks 250, to facilitate oscillation of the fluid spray bar 60 when used in conjunction with a cam 242 and spring 244. The oscillation may allow fewer spray nozzles 200, or may allow the spray nozzles 200 to be constructed to provide a spray flow having a narrower angle pattern, rather than the large angled spray flow used to clean the web 40 in a non-oscillating system. The oscillation motion provides complete coverage and, thus, complete cleaning of the polishing area on web 40.

FIG. 14 illustrates a top view of the fluid spray bar 60 as it traverses the rails 80, along path T-T. Inlet 166 and guiding member 167 are also illustrated. The fluid spray bar 60 is coupled between guide blocks 250, as illustrated more fully in FIG. 15. The guide blocks 250 facilitate the movement of the spray bar 60 along path T-T by the rotation of the lead screws 110. If the system is a non-belt system, as previously discussed, only one lead screw 110 may be used. In this case, a guide rod 150 may be used to better control the movement of the fluid spray bar 60, as it traverses path T-T on the guide blocks 250.

Figure 15:
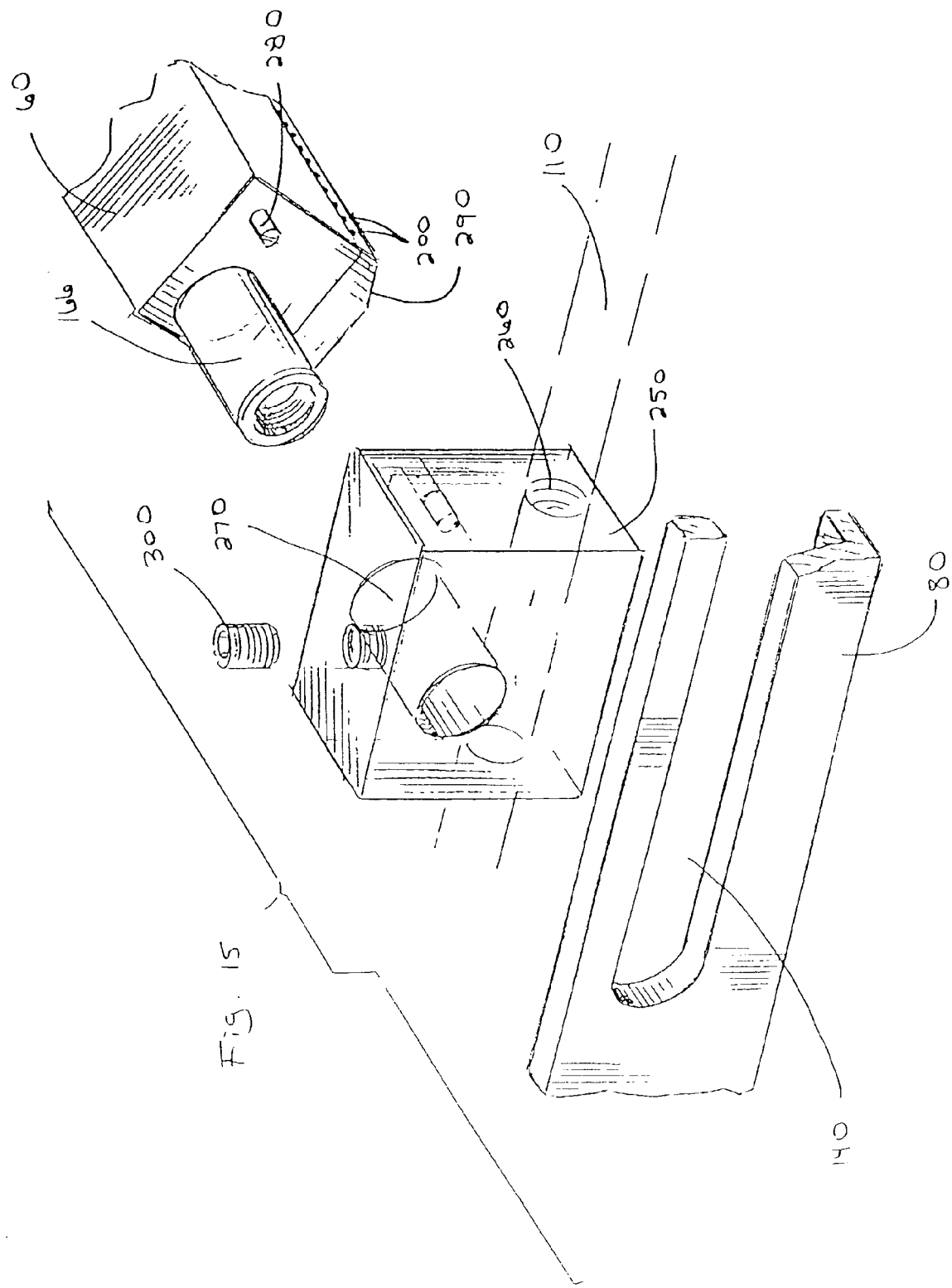
FIG. 15 illustrates an exploded perspective view of a portion of the fluid spray bar and frame assembly.

FIG. 15 illustrates an exploded perspective view of the fluid spray bar 60 and frame assembly 70. For fluid spray bar 60 to slide along lead screw 110, a guide block 250 may be used. The guide block 250 holds fluid spray bar 60 in place. The guide block 250 includes screw threads 260 through which the lead screw 110 may be mounted. As the lead screw 110 rotates, screw threads 260 force the guide block 250 down the length of the lead screw 110. The fluid spray bar 60 is coupled to the guide block 250 and, thus, traverses the length of the lead screw 110 along with the guide block 250. The inlet 166 of the fluid spray bar 60 is fed through opening 270 in the guide block 250. To ensure proper alignment of the spray nozzles 200 with respect to the web 40 (not shown), a guide pin 280 is located on the fluid spray bar 60. The guide pin 280 ensures that the spray nozzles 200 of fluid spray bar 60 be angled with respect to the web 40 (not shown). The fluid spray bar 60 is held in place in the guide block 250 by set screw 300. The inlet 166 through which the cleaning fluid enters the fluid spray bar 60 is long enough to run completely through the opening 270 and out the other side of the guide block 250. The excess length in the inlet 166 is oriented in such a way as to facilitate the coupling of inlet 166 with fluid hose slot 140 in rail 80. This configuration will allow the fluid spray bar 60 to traverse the length of the web in a stable and controlled manner.

FIG. 16 illustrates an alternate embodiment in which the fluid spray bar 60 may contain an additional chamber 300 which is isolated from fluid chambers 162, 164 and 190. As discussed previously, chambers 162, 164 and 190 will allow the deposition of web cleaning fluid as the fluid spray bar 60 travels in one direction along the web 40 (not shown). Chamber 300 may allow the fluid spray bar 60 to deposit the planarizing fluid 50 (not shown) used for planarizing the wafer in the CMP process as it travels in a direction which is opposite of the first. This embodiment may eliminate the use of the carrier assembly 30 to deposit the planarizing fluid 50.

While one advantageous use of the present invention may be in a web-based system, it should be appreciated that the current system may be modified for use in a non-web-based system. A cleaning system as described herein may be used in any system which implements a CMP process and reuses a polishing pad between planarization cycles.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A fluid spray bar comprising:
a first elongated member having a first fluid chamber and a second fluid chamber fluidically coupled to the first fluid chamber;
a second elongated member having a third fluid chamber and having a plurality of nozzles fluidically coupled to the third fluid chamber, the second elongated member adapted to be coupled to the first elongated member with the third fluid chamber positionable in fluid communication with the second fluid chamber of the first elongated member; and
a polishing fluid chamber, the fluid chamber having a plurality of nozzles fluidically coupled to the polishing fluid chamber, wherein the fluid spray bar is configured to dispense a first material when the fluid spray bar moves in the first direction and a second material when the fluid spray bar moves in the second direction.

2. The fluid spray bar, as set forth in claim 1, wherein the fluid spray bar is configured to dispense a cleaning fluid onto a polishing pad in a chemical-mechanical planarization system.

3. The fluid spray bar, as set forth in claim 1, wherein the fluid spray bar is configured to be coupled to a frame to facilitate the movement of the fluid spray bar along a portion of a wafer polishing web.

4. The fluid spray bar, as set forth in claim 1, wherein the fluid spray bar is configured to dispense at least two materials.

5. The fluid spray bar, as set forth in claim 1, comprising a device configured to remove excess fluid from a surface after the fluid has been dispensed from the fluid spray bar onto the surface.

6. The fluid spray bar, as set forth in claim 1, wherein the polishing fluid chamber is fluidically isolated from each of the first fluid chamber, the second fluid chamber and the third fluid chamber.

7. The fluid spray bar, as set forth in claim 1, wherein the fluid spray bar is configured to move in each of a first direction and a second direction, opposite the first direction.

* * * * *

UNITED STATES PATENT AND TRADEMARK OFFICE
CERTIFICATE OF CORRECTION

PATENT NO. : 7,063,603 B2
APPLICATION NO. : 10/230571
DATED : June 20, 2006
INVENTOR(S) : Scott E. Moore et al.

It is certified that error appears in the above-identified patent and that said Letters Patent is hereby corrected as shown below:

Col. 10,

In claim 1, line 16, the portion reading "the first direction" should be changed to --a first direction--.

In claim 1, line 17, the portion reading "the second direction" should be changed to --a second direction--.

In claim 7, lines 2-3, the portion reading "a first direction and a second direction" should be changed to --the first direction and the second direction--.

Signed and Sealed this

First Day of July, 2008

JON W. DUDAS
*Director of the United States Patent and Trademark Office*